United States Patent
Kim et al.

[11] Patent Number: 5,929,483
[45] Date of Patent: Jul. 27, 1999

[54] SEMICONDUCTOR DEVICE HAVING SPACER AND METHOD OF MAKING SAME

[75] Inventors: Hyun-Sik Kim, Seongham; Heon-Jong Shin, Seoul, both of Rep. of Korea

[73] Assignee: Samsung Electronics Co., Ltd., Rep. of Korea

[21] Appl. No.: 09/113,624

[22] Filed: Jul. 10, 1998

[30] Foreign Application Priority Data

Oct. 8, 1997 [KR] Rep. of Korea ............ 97-51506

[51] Int. Cl.$^6$ .................................. H01L 27/088
[52] U.S. Cl. ............... 257/336; 257/344; 257/408; 257/900
[58] Field of Search .................. 257/408, 344, 257/336, 900

[56] References Cited

U.S. PATENT DOCUMENTS

| | | | |
|---|---|---|---|
| 5,089,865 | 2/1992 | Mitsui et al. | 357/23.4 |
| 5,091,763 | 2/1992 | Sanchez | 357/23.9 |
| 5,278,441 | 1/1994 | Kang et al. | 257/371 |
| 5,444,282 | 8/1995 | Yamaguchi et al. | 257/344 |
| 5,710,450 | 1/1998 | Chau et al. | 257/344 |
| 5,719,425 | 2/1998 | Akram et al. | 257/344 |

*Primary Examiner*—William Mintel
*Attorney, Agent, or Firm*—Lappin & Kusmer LLP

[57] ABSTRACT

A semiconductor device having a double spacer and a method of manufacturing the device are provided. The semiconductor device includes a first spacer formed on the sidewall of a gate electrode and a second spacer formed on the slanted sidewall of the first spacer. A first impurity region is formed doped with a first conductivity type impurity at a first concentration and formed at a small junction depth in the substrate to self-align at the edge of the gate electrode. A second impurity region doped with a second conductivity type impurity at a second concentration is formed at a large junction depth in the substrate to self-align at the edge of the first spacer. A third impurity region doped with the first conductivity type impurity at a third concentration is formed at a medium junction depth in the second impurity region to self-align at the edge of the second spacer.

9 Claims, 5 Drawing Sheets

SEMICONDUCTOR DEVICE HAVING SPACER AND METHOD OF MAKING SAME

BACKGROUND OF THE INVENTION

1. Field of the Invention

The present invention relates to a semiconductor device and, more particularly, to a semiconductor device having a double spacer and a method of making the same to enhance the reliability of the semiconductor device.

2. Discussion of Related Art

The miniaturization of devices according to a scaling rule is used in a semiconductor device to achieve large-scale integration and high-speed operation. In MOS devices, this leads to a decrease in the threshold voltage due to shortening of the channel. Also, the effect of a depleted layer upon the channel in a source/drain region is reduced so as to attain a stable threshold voltage in the semiconductor device. To meet the requirements such as large-scale integration and high operational speed, semiconductor devices generally have a pocket implantation region or a thin junction layer formed by a rapid heat treatment to increase the concentration of dopants in a localized region of the substrate.

FIGS. 1–3 contain schematic cross-sectional diagrams illustrating a method of fabricating a prior art semiconductor device. In the prior art device illustrated in FIGS. 1–3, a device separating region 12 is formed in a p-type silicon substrate 10 by a known LOCOS step. As shown in FIG. 1, a gate oxide layer 14 is formed on the upper surface of the active region of a silicon substrate 10, and a conductive layer is formed on the gate oxide layer 14. The conductive layer is subjected to photolithographic and etching steps to form a gate electrode 16. A buffer oxide layer 18 is deposited on the the gate electrode 16 by an oxidation step. Using the buffer oxide layer 18 as a mask, arsenic (As) is typically lightly implanted as an n-type impurity to form a lightly doped LDD region 20 which self aligns at the edge of the gate electrode 16 in the vicinity of the surface of the silicon substrate 10.

Referring to FIG. 2, an oxide layer is then formed on the structure as an insulating layer. The structure is then subjected to a back-etching step to form a spacer 22 on the sidewalls of the gate electrode 16.

As shown in FIG. 3, using the spacer 22 as a mask, boron (B) is implanted as a p-type impurity in a medium concentration and at the same time arsenic (As) is heavily implanted as an n-type impurity. This results in a B-doped pocket implantation region 24 and an As-doped source/drain region 26 which self-align at the edge of the spacer 22 in the vicinity of the surface of the silicon substrate 10. The resulting product is then subjected to a rapid heat treatment step so that the pocket implantation region 24 has a shape surrounding the source/drain region 26.

One drawback to this prior art approach is that the semiconductor device is generally subjected to a very rapid heat treatment at high temperature for a short time in order to form a thin junction. This makes it very difficult to diffuse dopants of the pocket implantation region 24 in a controlled fashion to a desired depth, i.e., under the source/drain region 26. This can result in device reliability problems and reduced device performance.

SUMMARY OF THE INVENTION

Accordingly, the present invention is directed to a semiconductor device having a double spacer and its fabricating method which substantially obviate one or more of the problems due to limitations and disadvantages of the related art.

An object of the present invention is to provide a double spacer on the sidewalls of a gate electrode such that a pocket implantation region can be formed stably to a desired depth under a source/drain region with increased concentration compared to the substrate, thus enhancing the reliability of the semiconductor device, especially in devices having channel lengths between 0.3 and 0.5 $\mu$m.

To achieve these and other objects and advantages, the semiconductor device in accordance with the invention includes a gate insulating layer formed over the surface of a semiconductor substrate and a gate electrode formed over the gate insulating layer. A first spacer is formed over the sidewall of the gate electrode, and a second spacer is formed over the sidewall of the first spacer. A first impurity region doped with a first conductivity type impurity at the first concentration is formed at a first junction depth in the substrate to self-align near the edge of the gate electrode. A second impurity region doped with a second conductivity type impurity at the second concentration is formed at a second junction depth in the substrate to self-align near the edge of the first spacer. A third impurity region doped with a the first conductivity type impurity at a third concentration is formed at a third junction depth in the second impurity region to self-align near the edge of the second spacer. The third junction depth is less than the second junction depth.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

FIGS. 1–3 containing schematic cross-sectional diagrams illustrating steps in a method of fabricating a semiconductor device according to prior art;

FIG. 4 is a schematic vertical cross-sectional diagram of a semiconductor device having a double spacer in accordance with the present invention; and FIGS. 5–9 are schematic cross-sectional diagrams illustrating steps in a method of fabricating a semiconductor device according to the present invention.

DETAILED DESCRIPTION OF PREFERRED EMBODIMENT

Reference will now be made in detail to the preferred embodiments of the present invention, examples of which are illustrated in the accompanying drawings.

Figure 1:
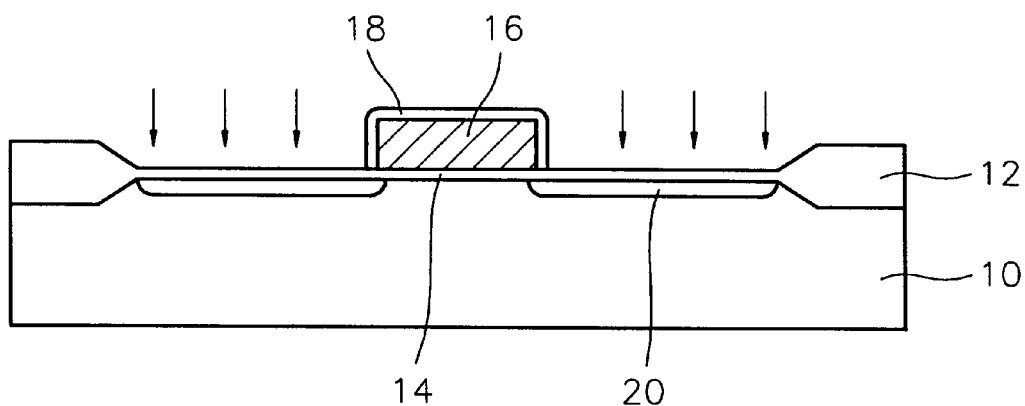
Figure 2:
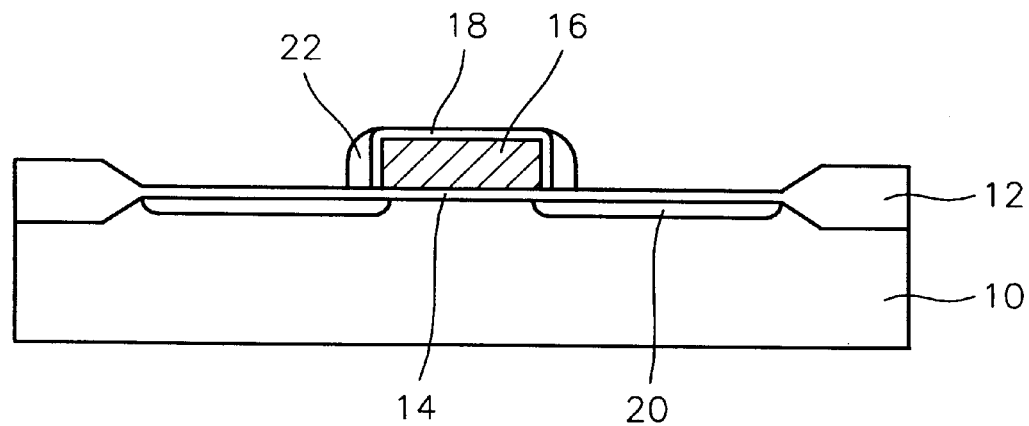
Figure 3:
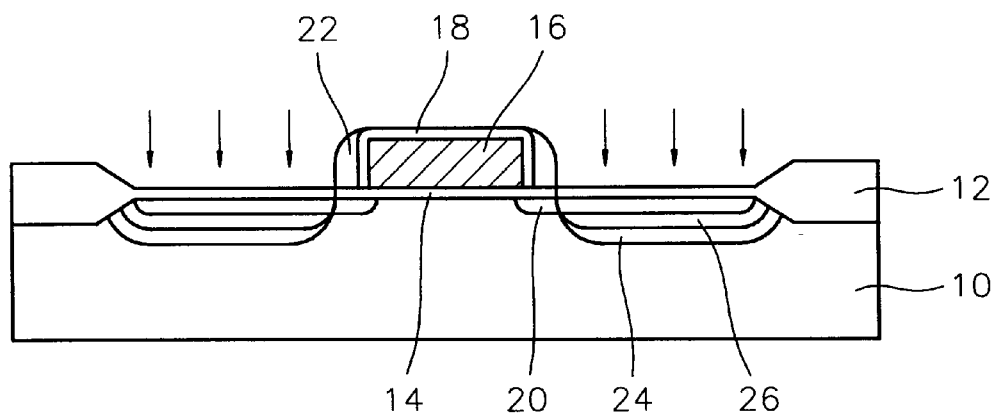
Figure 4:
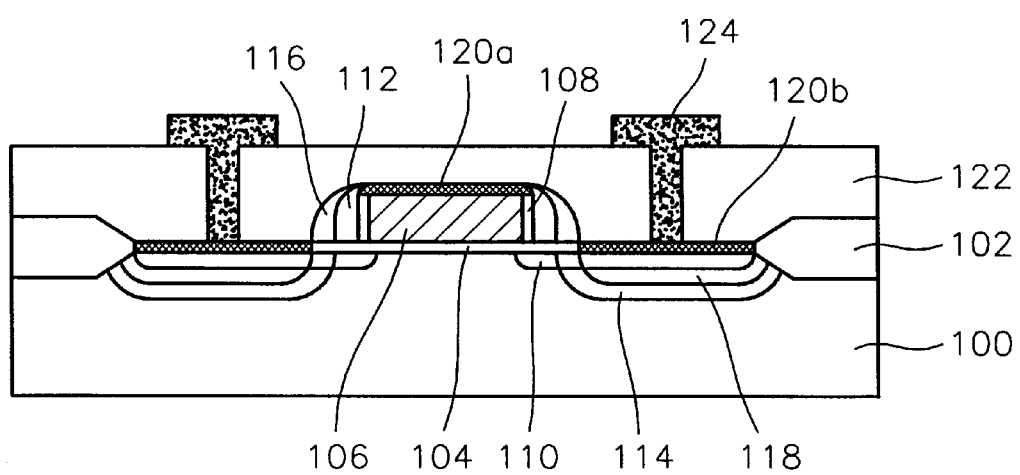

FIG. 4 is a schematic vertical cross section of a semiconductor device having a double spacer in accordance with the present invention. Referring to FIG. 4, the semiconductor device includes a device separating region 102 for defining the active region of devices formed in, for example, a p-type silicon substrate 100. A gate oxide layer 104 is formed over the surface of the active region in the substrate 100, a gate electrode 106 is formed over a selected region of the gate oxide layer 104, and a buffer oxide layer 108 is formed over the upper surface of the gate electrode 106. A first spacer 112 is formed on the sidewall of the buffer oxide layer 108, and a second spacer 116 is formed on the sidewall of the first spacer 112.

An LDD region 110 is formed as a first impurity region lightly doped with, for example, an n-type impurity in the vicinity of the surface of the substrate 100 to self-align at the edge of the gate electrode 106. A pocket implantation region 114 is formed as a second impurity region doped with, for example, p-type impurity in a medium concentration in the vicinity of the surface of the substrate 100 to self-align at the edge of the first spacer 112. A source/drain region 118 is formed as a third impurity region heavily doped with, for example, an n-type impurity in the vicinity of the surface of the substrate 100 to self-align at the edge of the second spacer 116.

Silicide layers 120a and 120b can be formed over the buffer oxide layer 108 and the source/drain region 118, respectively. An interlevel insulating layer 122 can be formed over the structure to isolate devices, and a metal electrode 124 can be formed through the interlevel insulating level 122 via a contact hole to contact the silicide layer 120b to provide for electrical contact with the device.

In the semiconductor device shown in FIG. 4 and described above, the first spacer 112 is used as a mask to form the pocket implantation region 114, and the second spacer 116 is used as a mask to form the source/drain region 118. This dual-mask approach according to the present invention allows the sizes, depths and dopant concentrations of the pocket implantation region 114 and the source/drain region 118 to be more precisely controlled. Hence, a more stable pocket implantation region at a dopant concentration higher than that of the surrounding substrate can be formed in a precise manner to surround the source/drain region 118. This pocket implantation region 114 of controlled size minimizes the effect of the depleted layer upon the channel in the source/drain region and also solves the problem of a reverse short channel having an increased gate threshold voltage.

FIGS. 5–9 are schematic cross-sectional diagrams illustrating a method of fabricating the semiconductor device according to the present invention. It should be noted that the description herein specifies an NMOS transistor as an illustrative embodiment of the invention. This selection is intended as an illustration only. It will be understood that the invention is applicable to other structures, such as PMOS transistors. Also, the specific dopants referred to, namely arsenic and boron, are used for illustration of one embodiment of the invention. Other dopants can be used in accordance with the invention.

Figure 5:
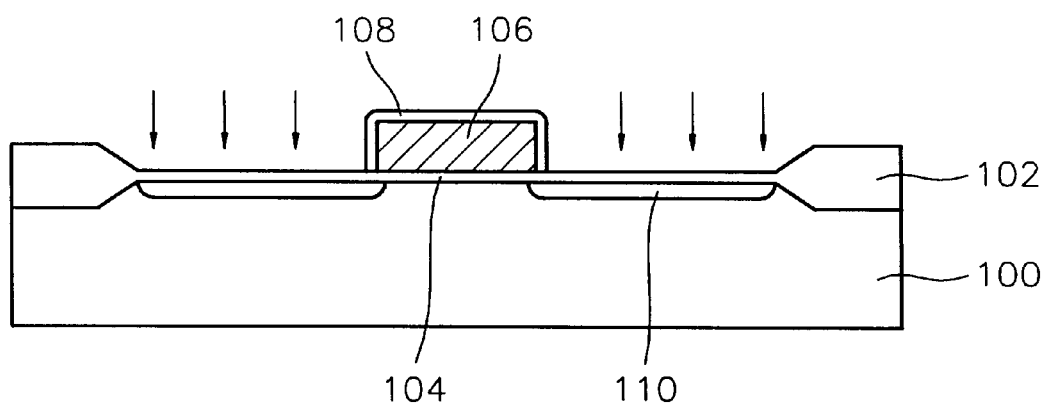

As shown in FIG. 5, the device separating region 102 is formed in, for example, a p-type silicon substrate 100 by a known LOCOS step to define the active region of the device. A gate oxide layer 104 is formed over the upper surface of the active region of the silicon substrate 100. A conductor layer is then formed over the gate oxide layer 104. The resulting structure is subjected to photolithographic and etching steps to form the gate electrode 106. The buffer oxide layer 108 in the 30 to 100 Å range of thickness is then deposited over the upper surface of the gate electrode 106 by an oxidation step. Using the buffer oxide layer 108 as a mask, arsenic (As) as an n-type impurity of about $1 \times 10^{12}$ to $1 \times 10^{14}$ concentration is implanted with an implantation energy of about 10–30 KeV, forming a lightly doped LDD region 110 self-aligning at the edge of the gate electrode 106 in the vicinity of the surface of the silicon substrate 100.

Figure 6:
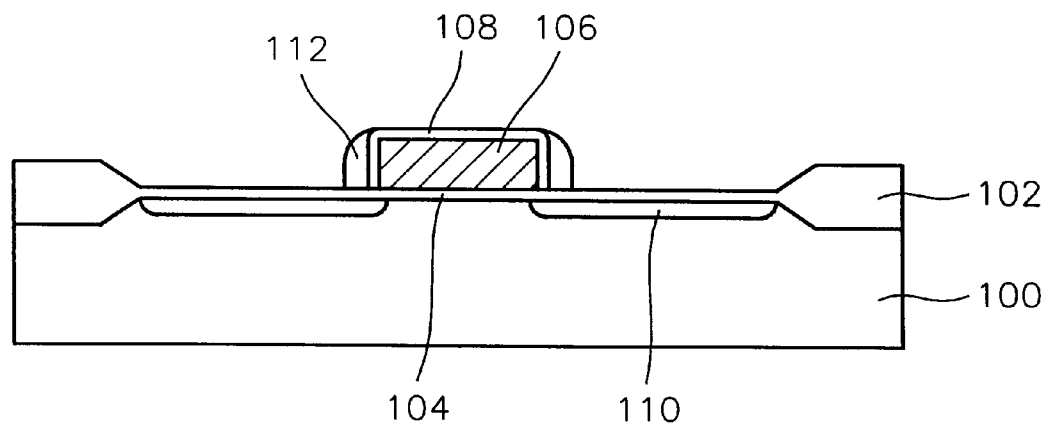

As shown in FIG. 6, an oxide layer is then deposited as an insulating layer and is subjected to a back-etching step to form the first spacer 112 on the sidewall of the buffer oxide layer 108. The first spacer 112 will be used as a mask to form the pocket implantation region 114 in a subsequent ion-implantation step.

Figure 7:
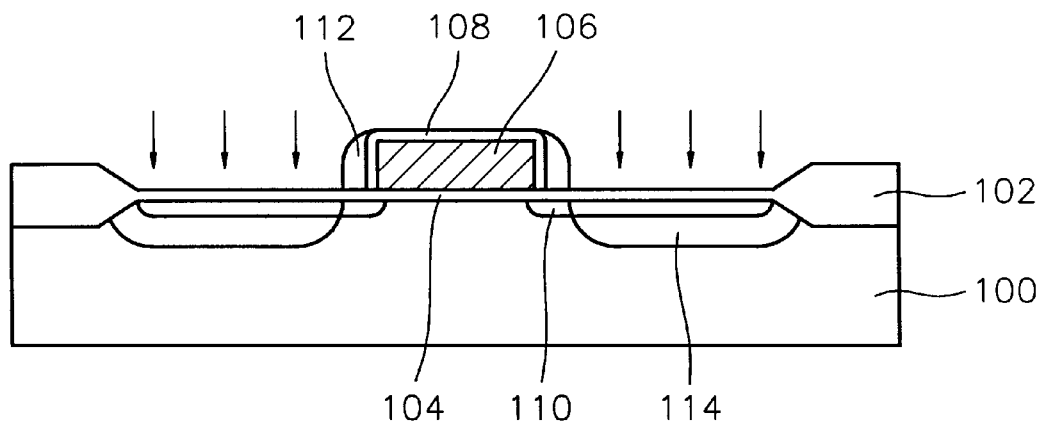

As shown in FIG. 7, using the first spacer 112 as a mask, boron (B) as a p-type impurity of about $1 \times 10^{12}$ to $1 \times 10^{14}$ concentration is implanted at an implantation energy of between 30 and 50 KeV. This results in formation of the pocket implanted region 114, doped with boron in a medium concentration, self-aligned at the edge of the first spacer 112 in the vicinity of the surface of the substrate 110.

Figure 8:
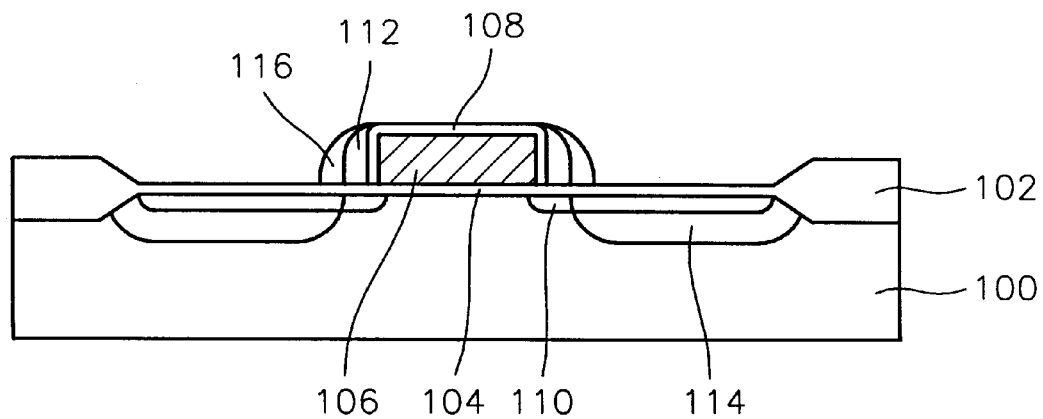

As shown in FIG. 8, an oxide layer is then deposited as an insulating layer and is subjected to a back-etching step to form the second spacer 116 on the sidewall of the first spacer 112. The second spacer 116 will be used as a mask to form the source/drain region 118 in a subsequent ion-implantation step.

Figure 9:
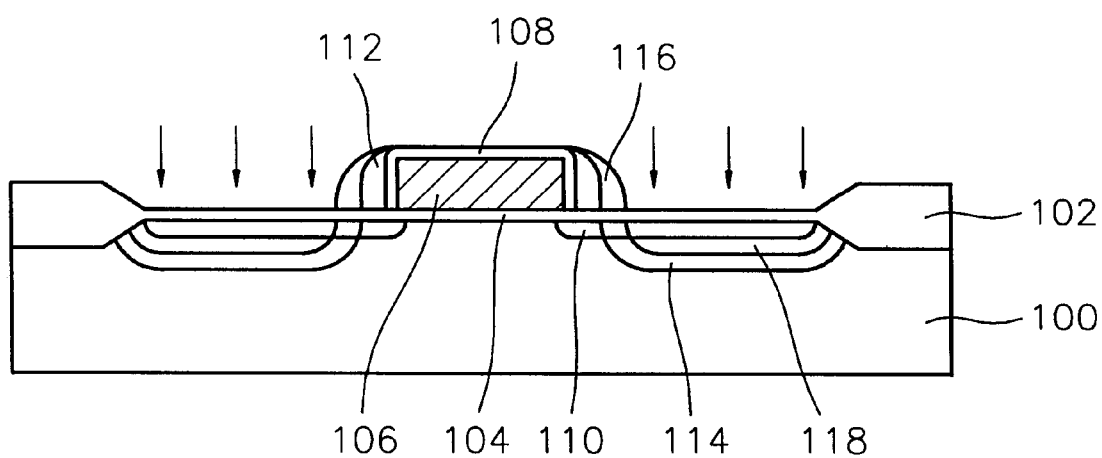

As shown in FIG. 9, using the second spacer 116 as a mask, arsenic (As) as an n-type impurity of about $1 \times 10^{15}$ to $5 \times 10^{15}$ concentration is implanted at an implantation energy of between 50 and 80 KeV. This forms the heavily doped source/drain region 118 self-aligned at the edge of the second spacer 116 in the vicinity of the surface of the substrate 100.

Next, the silicide layers 120a and 120b are formed over the gate electrode 106 and source/drain region 118, respectively. Then an interlevel insulating layer 122 for isolating each device is formed, and a metal electrode 124 in contact with the silicide layer 120b via a contact hole in the interlevel insulating layer 122 for the purpose of a metallization step is also formed.

According to the method of the present invention as described above, first and second spacers 112 and 116 are formed such that the pocket implantation region 114 and the source/drain region 118, respectively, are self-aligned. As a result, the pocket implantation region 114 and source/drain region 118 are spaced from each other by a predetermined controllable distance. As a result, the dopants of the pocket implantation region 114 can be diffused sufficiently to surround the source/drain region 118, even though a rapid heat treatment to form a thin junction may also be performed for a short time.

Thus, one advantage of the present invention is that the pocket implantation region 114 can be formed in a stable, controllable, precise fashion to a desired depth under the source/drain region 118 with a higher dopant concentration than that of the substrate. This advantage is realized by providing a double spacer on the sidewalls of the gate electrode. The result is that the reliability of the semiconductor device is greatly enhanced, particularly in devices that have short channel lengths, for example, between 0.5 and 0.3 $\mu$m.

While this invention has been particularly shown and described with references to preferred embodiments thereof, it will be understood by those skilled in the art that various changes in form and details may be made therein without departing from the spirit and scope of the invention as defined in the following claims.

We claim:

1. A semiconductor device, comprising:
    a gate insulating layer formed over the surface of a semiconductor substrate;
    a gate electrode formed over the gate insulating layer;
    a first spacer formed over a sidewall of the gate electrode;
    a second spacer formed over a sidewall of the first spacer;
    a first impurity region doped with a first conductivity type impurity at a first concentration, said first impurity region being formed at a first junction depth in the substrate to self-align near the edge of the gate electrode;
    a second impurity region doped with a second conductivity type impurity at a second concentration, said second impurity region being formed at a second junction depth in the substrate to self-align near the edge of the first spacer; and a third impurity region doped with the first conductivity type impurity at a third concentration, said third impurity region being formed at a third junction depth in the second impurity region to self-align near the edge of the second spacer, the third junction depth being less than the second junction depth.

2. The semiconductor device as defined in claim 1, wherein a surface of the gate electrode is subjected to a surface oxidation.

3. The semiconductor device as defined in claim 1, wherein the first conductivity type is N type and the second conductivity type is P type.

4. The semiconductor device as defined in claim 1, wherein the first conductivity type is P type and the second conductivity type is N type.

5. The semiconductor device as defined in claim 1, wherein the first spacer comprises an insulating layer.

6. The semiconductor device as defined in claim 1, wherein the second spacer comprises an insulating layer.

7. The semiconductor device as defined in claim 1, wherein the second concentration is greater than the first concentration and less than the third concentration.

8. The semiconductor device as defined in claim 1, wherein the third concentration is greater than the first and second concentrations.

9. The semiconductor device as defined in claim 1, wherein the first concentration is less than the second concentration and the third concentration.

* * * * *

UNITED STATES PATENT AND TRADEMARK OFFICE
CERTIFICATE OF CORRECTION

PATENT NO. : 5,929,483
DATED : July 27, 1999
INVENTOR(S) : Hyun-Sik Kim, et. al.

It is certified that error appears in the above-identified patent and that said Letters Patent is hereby corrected as shown below:

Title page, item [54] and col. 1, line 1, before "Spacer," insert --Double--.

Signed and Sealed this

Twenty-seventh Day of June, 2000

Attest:

Q. TODD DICKINSON

*Attesting Officer*  *Director of Patents and Trademarks*